United States Patent [19]

Minagawa et al.

[11] 4,357,553
[45] Nov. 2, 1982

[54] SURFACE-ACOUSTIC-WAVE DEVICE

[75] Inventors: Shoichi Minagawa; Takamasa Sakai; Takeshi Okamoto; Morihiro Niimi, all of Toda, Japan

[73] Assignee: Clarion Co., Ltd., Tokyo, Japan

[21] Appl. No.: 177,966

[22] Filed: Aug. 14, 1980

[30] Foreign Application Priority Data

Aug. 14, 1979 [JP] Japan .................................. 54/102777
Aug. 15, 1979 [JP] Japan .................................. 54/103097
Aug. 16, 1979 [JP] Japan .................................. 54/103573

[51] Int. Cl.³ ............................................. H03F 7/00
[52] U.S. Cl. ................................. 310/313 B; 307/424
[58] Field of Search ................... 330/5.5; 310/313 R, 310/313 A, 313 B, 313 C, 313 D, 313 R, 313 A, 313 B; 357/26, 22, 23, 26; 307/424

[56] References Cited

U.S. PATENT DOCUMENTS

| 3,634,151 | 1/1972 | Sato | 148/178 |
| 3,833,867 | 9/1974 | Solie | 333/30 R |
| 4,124,828 | 11/1978 | Bert | 333/30 R |
| 4,134,623 | 1/1979 | Tournois et al. | 310/313 |

Primary Examiner—A. T. Grimley
Assistant Examiner—D. L. Rebsch
Attorney, Agent, or Firm—Blanchard, Flynn, Thiel, Boutell & Tanis

[57] ABSTRACT

A surface-acoustic-wave device has a laminate formed of a semiconductor and a piezoelectric layer and a depletion layer control means locally provided at an interface portion of the semiconductor and said piezoelectric layer, wherein a parametric interaction is caused at a region other than an area where the depletion layer control means is provided and a depletion layer capacitance is controlled by applying a DC bias voltage and a pumping voltage to the depletion layer control means.

17 Claims, 20 Drawing Figures

SURFACE-ACOUSTIC-WAVE DEVICE

BACKGROUND OF THE INVENTION

1. Field of the Invention

This invention relates to a surface-acoustic-wave device which can function as a surface-acoustic-wave amplifier, and more particularly to a surface-acoustic-wave device having a depletion layer control means formed of a p-n junction at an interface portion between a semiconductor and a piezoelectric layer which is capable of preventing application of a DC voltage to the piezoelectric layer so as to minimize voltage hysteresis and assure stable characteristics.

2. Description of Prior Art

As disclosed in U.S. Patent Application Ser. No. 948,826, the assignee of the present invention has developed a surface-acoustic-wave device as illustrated in FIG. 1, which is operative by a continuous wave and has a desired S/N ratio, a high Q value when used as a frequency selecting device, and a wide available input frequency band.

Figure 1:
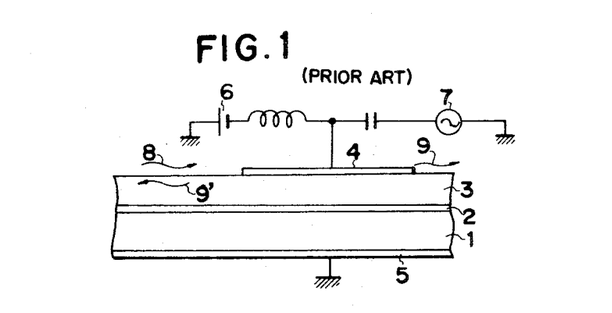
FIG. 1 is a side elevational view of a conventional surface-acoustic-wave device.

In FIG. 1, 1 is a semiconductor substrate, on which an insulator film 2 and a piezoelectric layer 3 are superposed to form a laminate, and 4 is an electrode provided on the piezoelectric layer 3 for applying a DC bias voltage and a pumping power thereto. 5 is an ohmic electrode, 6 is a DC power source for applying a DC bias voltage, and 7 is a high frequency power source for applying a pumping power.

In the so formed surface-acoustic-wave device, it will be seen that when a DC bias voltage and a pumping power are applied to the laminate through the electrode 4, a surface-acoustic-wave input signal 8 is amplified, in the course of propagation through an operation region beneath the electrode 4, by a parametric interaction with a depletion layer capacitance at a surface of the semiconductor substrate 1 through a piezoelectric effect of the piezoelectric layer 3, and amplified surface-acoustic-wave signals 9, 9' are outputted through suitable output means (not illustrated).

In the practical manufacturing of the surface-acoustic-wave device as described above, the following materials may be selected for the respective components of the device to curtail the material costs and the manufacturing costs: silicon (Si) for the semiconductor substrate 1; silicon dioxide (SiO$_2$) for the insulating film 2; and zinc oxide (ZnO) for the piezoelectric layer 3. The piezoelectric layer 3 of zinc oxide is easily laminated on the substrate 1 by an ordinary method such as evaporation, sputtering, etc.

As described above, for operation, this conventional surface-acoustic-wave device is applied, at the surface of the semiconductor substrate 1, with a DC bias voltage through the electrode 4. In this connection, it is to be noted that there is caused a phenomenon of voltage hysteresis, after the DC bias voltage is removed (the voltage is lowered to zero). The voltage hysteresis is a phenomenon that the state of the surface portion of the semiconductor substrate 1, once applied with the DC bias voltage, does not return to its original state after removal of the voltage. Therefore, it is difficult to definitely determine a value of a bias voltage for an optimum operation and to assure stable characteristics.

Although a cause of the phenomenon is not yet fully known, it has been said that electric charge injected into the layer of zinc oxide formed by evaporation through the electrode 4 by application of the DC bias voltage is caught by the layer and moves through the layer.

OBJECT OF THE INVENTION

It is therefore an object of the present invention to provide a surface-acoustic-wave device which can obviate the disadvantage involved in the conventional surface-acoustic-wave device.

SUMMARY OF THE INVENTION

In accordance with the present invention, there is provided a surface-acoustic-wave device which comprises:
a laminate of a semiconducting material and a piezoelectric material;
a depletion layer control means locally provided at an interface portion of said semiconducting material and said piezoelectric material; and
a means for applying a DC bias voltage and a pumping voltage to said depletion layer control means to control depletion layer of said laminate and cause a parametric interaction at a region or regions other than a region where said depletion layer control means is provided.

BRIEF DESCRIPTION OF THE DRAWINGS

FIGS. 7 to 10 are fragmentary sectional views of various concrete and specific forms of the depletion layer control means of the device illustrated in FIG. 2: FIG. 7 illustrating a p-n junction; FIGS. 8 and 9 illustrating a p-n junction and a metal electrode deposited on the p-n junction; and FIG. 10 illustrating a Schottky junction;

DESCRIPTION OF PREFERRED EMBODIMENTS

The invention will be described in detail referring to the drawings.

Figure 2:
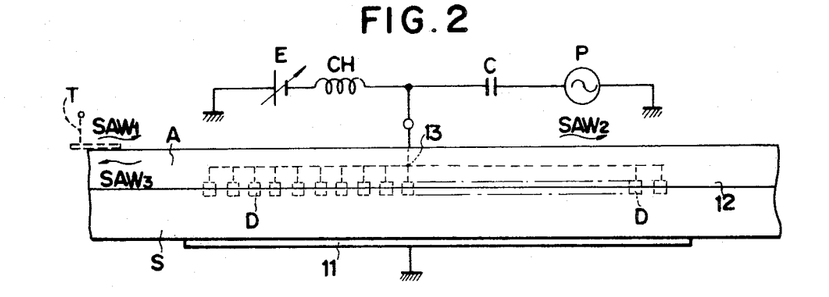
FIG. 2 is a side elevational view of one form of a surface-acoustic-wave device according to the present invention.

In FIG. 2, S is a semiconductor made, for example, of silicon (Si) and A is a piezoelectric layer made of zinc oxide. The semiconductor S and the piezoelectric layer A form a laminate.

The laminate is prepared, for example, by employing the semiconductor S as a substrate, forming a depletion layer control means as will be described in detail later on the substrate and depositing a piezoelectric material such as zinc oxide (ZnO) on the substrate in the form of a film by evaporation, sputtering, etc.

While the conductivity type of the semiconductor S may be either of p- and n- types in the present invention, n-type semiconductor is employed in the illustrated embodiment.

Numeral 11 designates an electrode for ohmic contact with the semiconductor S.

In accordance with the present invention, depletion layer control means D, D . . . is formed at the interface 12 of the semiconductor S and the piezoelectric layer A.

The depletion layer control means D may be any means which can form a depletion layer at the surface portion of the semiconductor S, such as a p-n junction or a Schottky junction. To provide the depletion layer control means D at the interface 12, a plurality of depletion layer control members D are arranged along the propagation direction of the surface acoustic wave $SAW_1$ as can be seen from FIG. 3.

Figure 3:
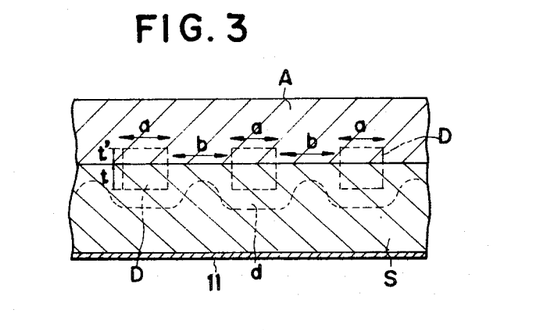
FIG. 3 is a sectional view of a main portion of the device as illustrated in FIG. 2.
Figure 4:
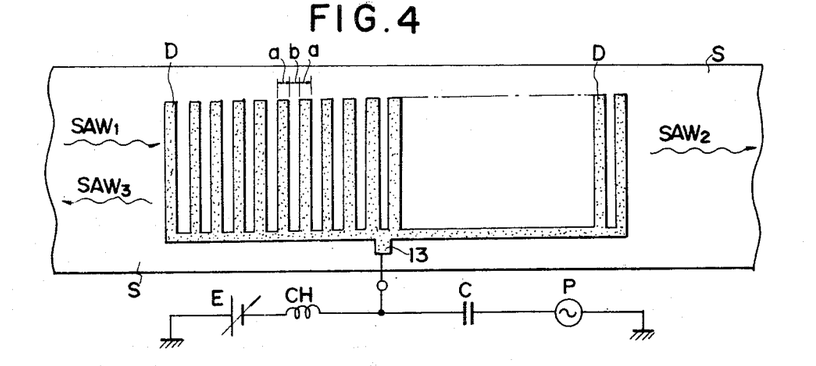
FIG. 4 is a plan view of the device illustrated in FIG. 2 with a piezoelectric layer removed, illustrating one example of arrangement of a depletion layer control means.

FIG. 4 illustrates one mode of a planar arrangement of the depletion layer control means D, D . . . , wherein the depletion layer control means D, D . . . is formed in a comb with one end (a lower end in FIG. 4) of each of the members D commonly connected with each other. A terminal 13 for external connection is provided at the commonly connecting portion as illustrated in FIG. 4. The terminal 13 is connected, at one side thereof, to a variable DC power source E for applying a DC bias voltage through a choke coil CH for blocking a high-frequency current and connected, at another side thereof, to a high-frequency power source P for supplying a pumping power through a capacitor C for blocking a DC current. Regions other than the area where the depletion layer control members D, D . . . are disposed, i.e., regions as indicated by b in FIG. 3 which are gap regions between the respective depletion layer control members D, D . . . , are utilized as parametric interaction regions so that a depletion layer d may be produced at the respective parametric interaction regions when a DC bias voltage is externally applied to the depletion layer control means D, D . . . .

As illustrated in FIG. 4, if the width of each of the depletion layer control members D in the propagation direction of the surface acoustic wave is assumed to be a and the gap between the respective depletion layer control members D, D, i.e., the width of each of the parametric interaction regions, is assumed to be b, there may preferably be a relation $a \leq b$. In this case, the gap region, i.e., parametric interaction region b, can be wider, so long as depletion layer d can be produced at the parametric interaction regions and the effective area of the parametric interaction regions relative to the whole device can be increased. This is advantageous to curtail material costs.

Depths t and t' of the depletion layer control means D in the semiconductor substrate S and the piezoelectric layer A, respectively, are varied depending upon various formations of the depletion layer control means. For instances, when the depletion layer control means D is formed of a p-n junction, the depth t in the semiconductor substrate S is 0.1 to 10 times as much as the width a. Such a depth will suffice to form a depletion layer d at the parametric interaction region which is sufficient for the desired operation of the device. On the other hand, the depth t' in the piezoelectric layer A is preferred to be as small as possible.

At least one of the width a of the depletion layer control member D and the width b of the parametric interaction region is selected to be smaller than a wavelength $\lambda$ of an input surface acoustic wave $SAW_1$. This is to reduce an influence of mechanical reflection of the surface acoustic wave at the boundary portion between the depletion layer control means D and the parametric interaction region and to prevent deterioration of the characteristics of the device.

More specifically, when the surface acoustic wave propagates through the depletion layer control means D and the parametric interaction regions alternatingly as a→b→a→b→. . . , the influence of the mechanical reflection of the surface acoustic wave at the respective boundaries of a and b is largest when $\lambda \simeq a, b$. To minimize the influence, the relation between a, b and $\lambda$ is preferably selected as given above.

Figure 5:
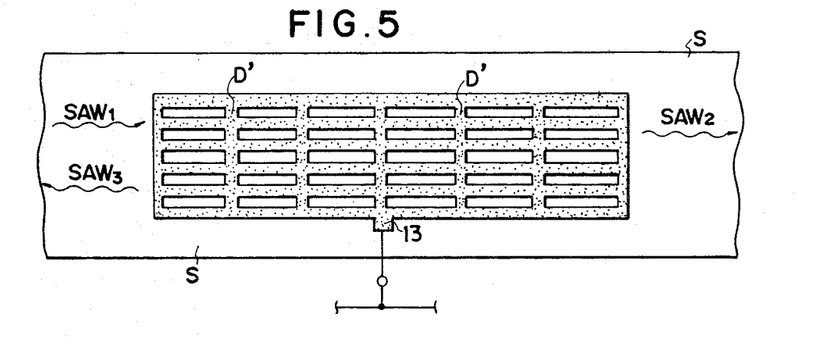
FIG. 5 is a similar plan view of the device illustrated in FIG. 2 with a piezoelectric layer removed, illustrating another example of arrangement of a depletion layer control means.
Figure 6:
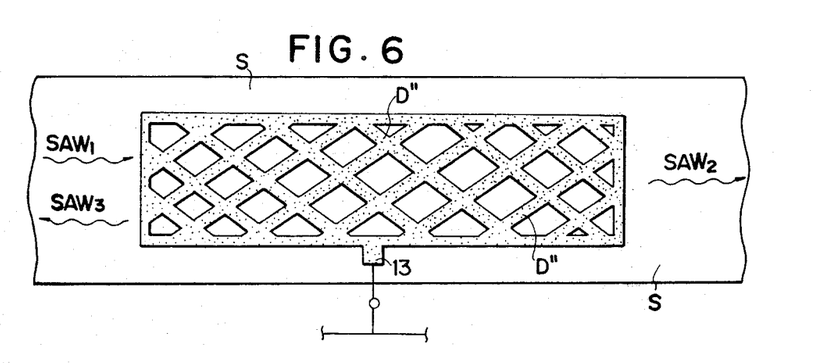
FIG. 6 is a similar plan view of the device illustrated in FIG. 2 with a piezoelectric layer removed, illustrating still another example of arrangement of a depletion layer control means.

FIGS. 5 and 6 illustrate other modes of planar arrangements of the depletion layer control means D. In FIG. 5, a means D' is arranged in a grid, while in FIG. 6, a means D" is arranged in a net or lattice.

Where the depletion layer control means D is arranged in a grid or net as illustrated in FIGS. 5 and 6, the control of the depletion layer d produced at the gaps or the parametric interaction region can be effected more easily.

In the surface-acoustic-wave device as illustrated in FIGS. 5 and 6, the widths a of the depletion layer control means D' and D" in the propagation direction of the surface acoustic wave and the widths b of the parametric interaction regions have a relation $a \leq b$, and at least one of the widths a and b is smaller than a wavelength $\lambda$ of the input surface acoustic wave.

More concrete and specific formation of the depletion layer control means D will now be described referring to FIGS. 7 to 10.

Figure 7:
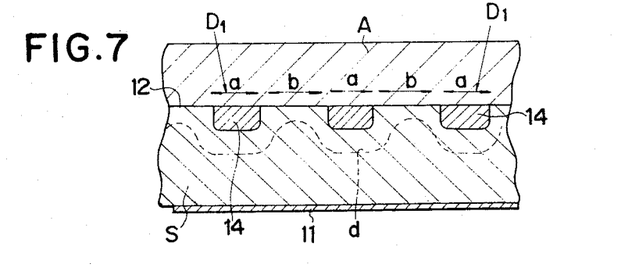

In FIG. 7, a depletion layer control means $D_1$ is formed of a p-n junction. P-type regions 14, 14 are formed at required positions of an n-type semiconductor S by selective diffusion. The depletion layer control means $D_1$ of the p-n junction is easy to be formed. If the employed semiconductor S is a p-type one, n-type regions are formed by selective diffusion.

Figure 8:
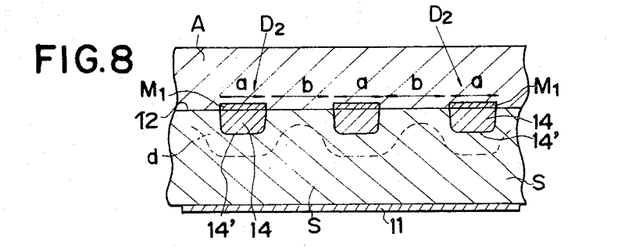

In FIG. 8, p-type regions 14, 14 where p-n junctions are formed respectively are covered with metal electrodes $M_1$. A control voltage such as a backward DC bias voltage is applied to the p-n junction portions 14', 14' . . . through the respective metal electrodes $M_1$, $M_1$ . . . .

When the metal electrodes $M_1$ are disposed as in FIG. 8, a control voltage can be applied uniformly all over the area where the depletion layer control means D is arranged, so that a loss of the pumping power etc. can be reduced and the characteristic of the surface acoustic wave device can be improved.

To enhance these effects, the metal electrodes M₁ may be in ohmic contact with the p-type regions 14, respectively.

Figure 9:
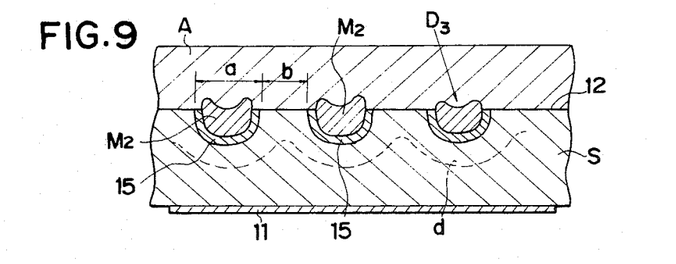

In FIG. 9, p-type regions 15 where p-n junctions are formed are U-shaped and metal electrodes M₂ are deposited on the concave portions, thereof.

In the preparation of such depletion layer control means D₃, a semiconductor S is selectively subjected to etching to form grooves thereon at portions where the depletion layer control means D is provided and then selective impurity diffusion is applied to the grooves to form p-type regions 15. A metal is deposited on the p-type regions 15, by evaporation to provide the metal electrodes M₂.

In the so formed device, since the metal electrodes M₂ per se have reduced resistance, a loss of the pumping power can further be reduced.

Figure 10:
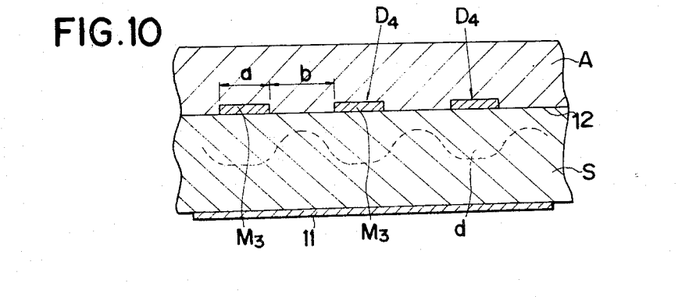

FIG. 10 illustrates a further form of depletion layer control means which includes a Schottky junction. The Schottky junction can be easily obtained by a simple treating operation such as simple depositing of metal electrodes M₃ on a semiconductor S.

As a material for the metal electrode M₃, there can be mentioned aluminum (Al) and molybdenum (Mo) for an n-type silicon semiconductor and gold (Au) for a p-type silicon semiconductor. With these metal electrodes, Schottky barriers are formed.

The surface-acoustic-wave device in accordance with the present embodiment of the invention will operate as follows:

First, a suitable value of backward DC bias voltage is applied from the DC power source E to the depletion layer control means D, D . . . to impart desired depletion layer capacitance nonlinearity to the parametric interaction regions. Since the depletion layer control means D, D . . . is disposed at the boundary 12 of the semiconductor S and the piezoelectric layer A, or directly on the surface of the semiconductor S, the depletion layer capacitance nonlinearity obtained is higher as compared with the conventional device. Furthermore, since the DC bias voltage is applied directly to the semiconductor S without passing through the piezoelectric layer A, unnecessary electric charge injected into the piezoelectric layer A can be avoided.

Then, a pumping voltage having a frequency $F_p$ is applied from the high-frequency power source P to the depletion layer control means, D, D . . . so as to be superposed on the DC bias voltage. As a result, the depletion layer capacitance caused at the parametric interaction regions is varied at the frequency $F_p$. At this time, since higher depletion layer capacitance nonlinearity is obtained as compared with the conventional device as described above, a smaller pumping voltage will suffice to make the depletion layer capacitance vary.

Under these conditions, a surface-acoustic-wave input signal SAW₁ having a frequency $F_1$ is propagated through the surface portion of the piezoelectric layer A via an input electrode such as that indicated in broken lines at T in FIG. 2. Although the surface-acoustic-wave input signal SAW₁ is propagated from the left towards the right in FIG. 2, the signal SAW₁ may be propagated in the opposite direction.

In the course when the surface-acoustic-wave input signal SAW₁ is propagated through the parametric interaction regions, namely, operation regions, the surface-acoustic-wave input signal is amplified by a parametric interaction with the depletion layer capacitance through a piezoelectric effect of the piezoelectric layer A to produce a travelling surface-acoustic-wave output SAW₂ having a frequency $F_2$ and a backward surface-acoustic-wave output SAW₃ having a frequency $F_3$. The frequencies of the input and output surface acoustic waves are in relations of $F_1=F_2$, $F_p=F_2+F_3$. The travelling surface-acoustic-wave output SAW₂ or the backward surface-acoustic-wave output SAW₃ is derived through an output electrode (not illustrated).

In this connection, it is to be noted that the parametric interaction with the surface-acoustic-wave signal is hardly caused at areas where the depletion layer control means D, D . . . is disposed so that the surface-acoustic-wave signal is not subject to amplification or attenuation there. Furthermore, since the width a of the depletion layer control means D and/or the width b the parametric interaction region is selected as being smaller than the wavelength λ of the surface-acoustic-wave input signal SAW₁, the influence of the mechanical reflection of the surface acoustic wave at the boundary of the depletion layer control means D and the parametric interaction region is reduced and the deterioration of the characteristics due to such influences can be avoided.

Figure 11:
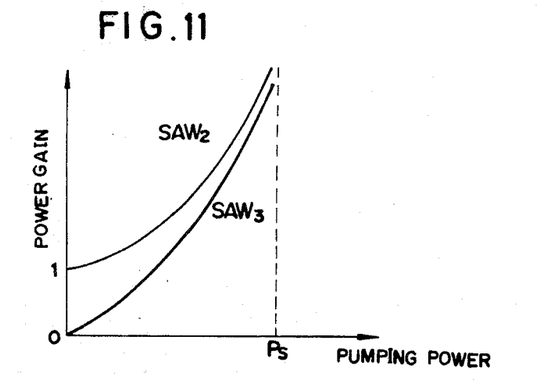
FIG. 11 is one example of a characteristic curve of power gain relative to pumping power in the device illustrated in FIG. 2.

FIG. 11 shows one example of a power gain characteristic of each of the travelling surface-acoustic-wave output SAW₂ and the backward surface-acoustic-wave output SAW₃ with respect to the pumping power having a frequency $F_p=2F_1$ supplied from the high-frequency power source P.

As can be seen from FIG. 11, when a pumping power larger than the threshold value Ps is applied, the power gain becomes infinite and a surface acoustic wave output signal is produced without the surface acoustic wave input signal SAW₁ having a frequency $F_1$, so that the device can operate as a surface-acoustic-wave generator for producing a travelling wave and a backward wave.

Figure 12:
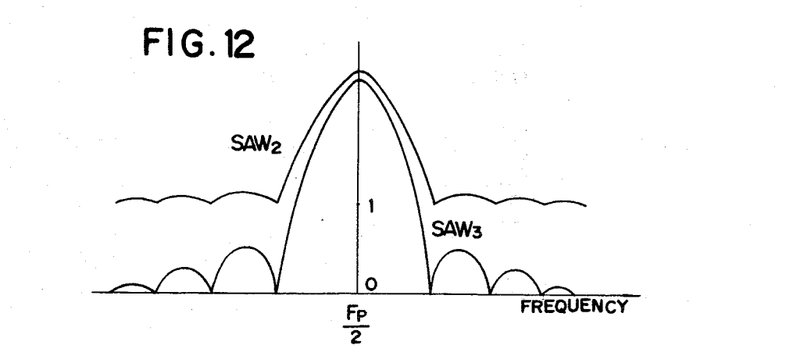
FIG. 12 is one example of a characteristic curve of frequency relative to power amplification gain in the device illstrated in FIG. 2.

FIG. 12 shows an example of a frequency characteristic of each of the power amplification gain. In the figure, a frequency $F_p/2$ is a center frequency of the output signal.

As the pumping power increases, the power amplification gain increases as described above and the passband width of the surface-acoustic-wave signal decreases to provide a high Q-value.

Although zinc oxide (ZnO) is employed for the piezoelectric layer A in this embodiment, there can be mentioned as other materials for the piezoelectric layer A lithium niobate (LiNbO₃), aluminum nitride (AlN), cadmium sulfide (CdS) and zinc sulfide (ZnS).

As described above, in accordance with the present embodiment, the depletion layer control means are partially and locally provided at the interface of the semiconductor and the piezoelectric layer to avoid application of the DC electric field to the piezoelectric layer, so that unnecessary injection of electric charge into the piezoelectric layer can be prevented and the phenomenon of voltage hysteresis can also be prevented. Thus, stable operation characteristics can be assured. Therefore, a piezoelectric film material such as zinc oxide, which can easily be formed into a layer, for example, by evaporation etc. and can be available at a low cost but is liable to catch electric charge, may be employed without losing stable operation characteristics.

Further in accordance with the present invention, since the depletion layer control means is formed directly on the surface of the semiconductor, a high depletion layer capacitance nonlinearity can be obtained, which allows obtainment of sufficient parametric interaction by a small pumping power and accordingly reduction of the required input pumping power.

Figure 13:
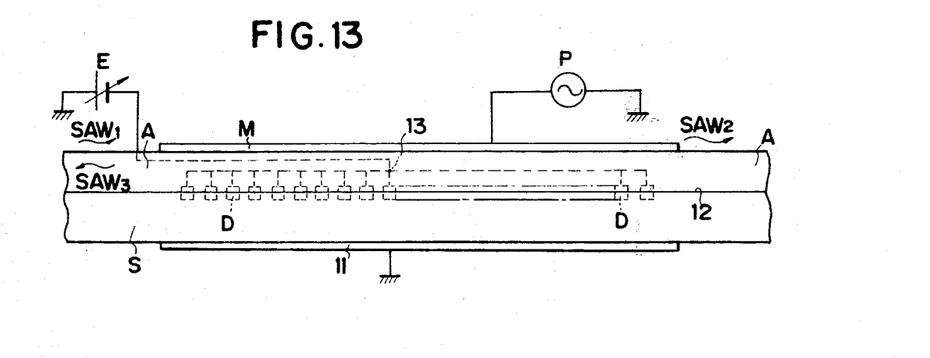
FIGS. 13 and 14 are side elevational views of other forms of surface-acoustic-wave device according to the present invention.

FIG. 13 illustrates a further embodiment of the present invention which has a pumping electrode M provided on a surface of the piezoelectric layer A for applying a pumping power.

In this embodiment, a pumping power is supplied to the electrode M and a connecting terminal 13 is connected to a variable DC power source E. Therefore, depletion layer control means D, D . . . is applied only with a DC bias voltage. The pumping electrode M has a size sufficient to cover all over the area where the depletion layer control means is disposed as illustrated in FIG. 13.

In accordance with this embodiment, the pumping electrode is provided independently of the depletion layer control means and the pumping power and the DC bias voltage are applied separately from each other, so that there is no need to employ a choke coil for blocking a high-frequency current and a capacitor for blocking a DC current to respective power lines.

Figure 14:
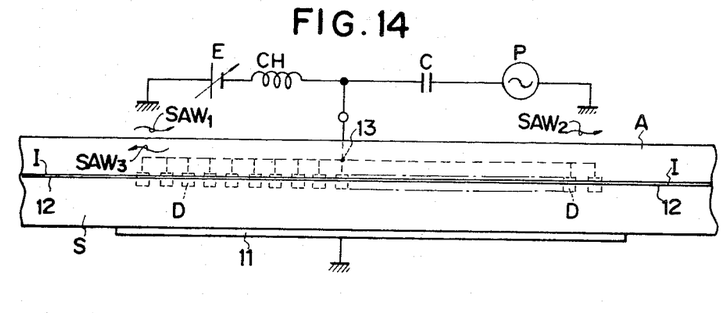

FIG. 14 illustrates a still further embodiment of the present invention which has an insulator film I for surface passivation.

The insulator film I for surface passivation has a thickness of, for example, 1,000 Å and acts as a film for passivation of the surface of the piezoelectric layer A. Where the piezoelectric layer A is formed by evaporation and has not sufficient dielectric resistance, the film is preferred to be provided to reduce a leak current through the piezoelectric layer A for assuring formation of the depletion layer at the surface portion of the semiconductor S and to reduce surface states of the semiconductor S for stabilizing the operation of the device.

To form a piezoelectric layer of, for example, zinc oxide (ZnO) on the surface passivation insulator film I, zince oxide is deposited in the form of a film by evaporation or sputtering on the insulator film I after depletion layer control means is formed on the surface portion of the semiconductor S or on the surface passivation insulator film I.

In this embodiment, the depletion layer control means D, D . . . is provided at the interface of the semiconductor S and the piezoelectric layer A where the surface passivation insulator film I is formed.

Concrete and specific examples of formation of the depletion layer control means D in the present embodiment will be described referring to FIGS. 15 to 20.

Figure 15:
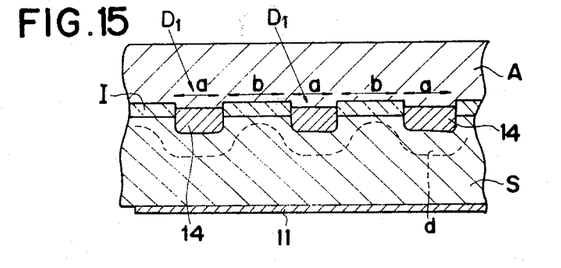
FIGS. 15 to 20 are fragmentary sectional views of various concrete and specific forms of depletion layer control means of the device illustrated in FIG. 14.

In FIG. 15, depletion layer control means $D_1$ is formed as a p-n junction. In preparation of the p-n junction, the surface passivation insulator film I is subjected to selective etching to form through-holes at required portions of the film I and p-type regions 14, 14 . . . are formed by selective diffusion effected at portions of n-type semiconductor S corresponding to the respective through-holes. The depletion layer control means $D_1$ has as an advantage that it can be formed easily.

In case where the semiconductor employed is of p-type, n-type regions are formed by similar selective diffusion.

Figure 16:
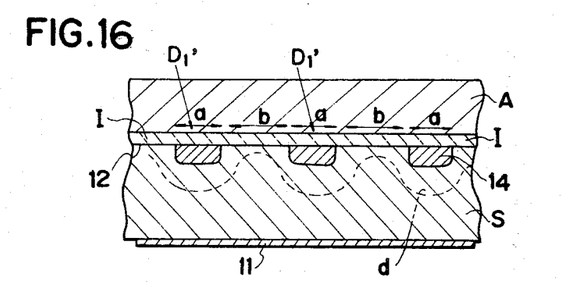

In this connection, it is to be noted that it is not essential for operation of the surface-acoustic-wave device to remove the surface passivation insulator film I at portions thereof corresponding to the p-type regions 14, 14 . . . as illustrated in FIG. 15, but the surface passivation insulator film I may be formed over both the portions where the p-type regions 14, 14 are formed and the portions where the p-type regions 14, 14 . . . are not formed, as shown in FIG. 16. In this case, the operation of the device can be more stable.

Figure 17:
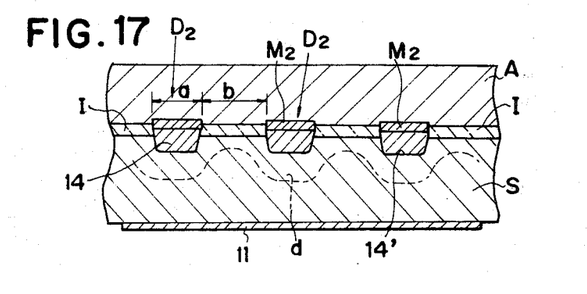
Figure 18:
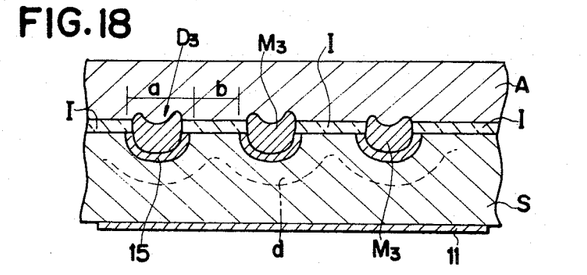

Structures of depletion layer control means of FIGS. 17 and 18 correspond to those of FIGS. 8 and 9, respectively.

Figure 19:
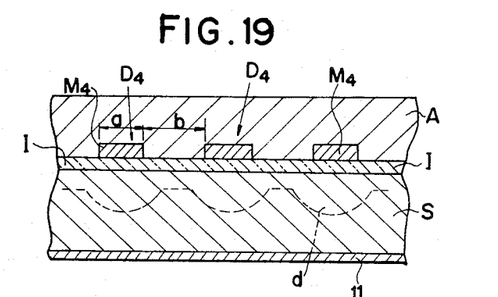

FIG. 19 illustrates depletion layer control means $D_4$ of a MIS (metal-Insulator Semiconductor) construction. In this MIS construction, a surface passivation insulator film I is utilized as an insulator for the MIS construction. Therefore, electrodes $M_4$ may be formed after a metal is deposited on the surface passivation insulator film I. Thus, a device having the MIS construction can be manufactured easily.

Figure 20:
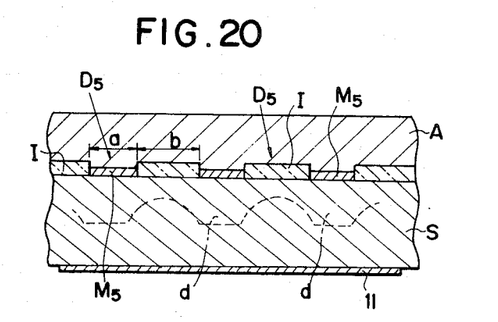

The structure of FIG. 20 corresponds to that of FIG. 10. A Schottky junction is easily formed by selectively removing required portions of a surface passivation insulator film I and depositing a metal on a semiconductor S at portions where the film I is removed to provide metal electrodes $M_5$.

In accordance with the present embodiment, since the surface passivation insulator film I is provided at the interface of the semiconductor S and the piezoelectric layer A, the influence of surface states of the semiconductor S and leak current through the piezoelectric layer A are reduced and the stability of the operation of the device can be enhanced.

The embodiment of FIG. 13 has a similar effect to that which is attainable by provision of the surface passivation insulator film.

The embodiments of the invention in which an exclusive property or privilege is claimed are defined as follows:

1. A surface-acoustic-wave device which comprises:
   a laminate of a semiconducting material and a piezoelectric material;
   means for propagating a surface-acoustic-wave through said piezoelectric material;
   depletion layer control means locally provided at an interface of said semiconducting material and said piezoelectric material; and
   means for applying a DC bias voltage and an AC pumping voltage between said depletion layer control means and a location on said semiconducting material spaced from said depletion layer control means, to cause a parametric interaction, between said surface-acoustic-wave propagated through said piezoelectric material and said pumping voltage, at a region or regions other than a region where said depletion layer control means is provided.

2. A surface-acoustic-wave device which comprises:
   a laminate of a semiconducting material and a piezoelectric material;
   means for propagating a surface-acoustic-wave through said piezoelectric material;
   depletion layer control means provided locally at an interface of said semiconducting material and said piezoelectric material;
   a pumping electrode provided on a surface of said piezoelectric material;
   means for applying a DC bias voltage between said depletion layer control means and a location on said semiconductor material spaced from said depletion layer control means; and means for applying an AC pumping voltage between said pumping electrode and a location on said semiconductor material;

whereby to cause a parametric interaction, between said surface-acoustic-wave propagated through said piezoelectric material and said pumping voltage, at a region or regions other than a region where said depletion layer control means is provided.

3. A surface-acoustic-wave device which comprises:
a laminate of a semiconducting material and a piezoelectric material;
means for propagating a surface-acoustic-wave through said piezoelectric material;
depletion layer control means provided locally at an interface of said semiconducting material and said piezoelectric material;
an insulating layer provided at said interface for surface passivation of said semiconducting material; and
means for applying a DC bias voltage and an AC pumping voltage between said depletion layer control means and a location on said semiconducting material spaced from said depletion layer control means, to cause a parametric interaction, between said surface-acoustic-wave propagated through said piezoelectric material and said pumping voltage, at a region or regions other than a region where said depletion layer control means is provided.

4. A surface-acoustic-wave device as claimed in claim 2, wherein said pumping electrode is aligned with and has an area greater in size than said depletion layer control means.

5. A surface-acoustic-wave device as claimed in claim 1 or 3, wherein said means for applying a DC bias voltage and a pumping voltage includes a pumping power source, a variable DC power source, a DC current blocking capacitor and an AC current blocking choke coil; said pumping power source being connected to said depletion layer control means through said DC current blocking capacitor; and said variable DC power source being connected to said depletion layer control means through said AC current blocking choke coil.

6. A surface-acoustic-wave device as claimed in claim 2, which further comprises an insulating layer provided between said semiconducting material and said piezoelectric material at said interface for surface passivation of said semiconducting material.

7. A surface-acoustic wave device as claimed in claim 2, wherein said means for applying a DC bias voltage includes a variable DC power source connected to said depletion layer control means, and said means for applying a pumping voltage includes a pumping power source connected to said pumping electrode.

8. A surface-acoustic-wave device as claimed in claims 1, 2, 3, 4, 6 or 7, wherein said depletion layer control means includes a p-n junction formed at said interface.

9. A surface-acoustic-wave device as claimed in claims 1, 2, 3, 4, 6 or 7, wherein said depletion layer control means includes p-n junctions at said interface and voltage applying electrodes provided at said p-n junctions.

10. A surface-acoustic-wave device as claimed in claims 1, 2, 3, 4, 6 or 7, wherein said depletion layer control means includes U-shaped p-n junctions at said interface and voltage applying electrodes deposited on the respective concave portions of said p-n junctions.

11. A surface-acoustic-wave device as claimed in claims 1, 2, 3, 6 or 7, wherein said depletion layer control means includes a Schottky junction at said interface.

12. A surface-acoustic-wave device as claimed in claim 3, wherein said depletion layer control means includes a metal-insulator semiconductor provided on said insulating layer at said interface.

13. A surface-acoustic-wave device as claimed in claims 1, 2, 3 or 6, wherein said depletion layer control means includes a plurality of spaced and electrically connected depletion layer control members arranged along a propagation direction of said surface-acoustic-wave.

14. A surface-acoustic-wave device as claimed in claim 13, wherein each of said depletion layer control members has a width in said propagation direction which is smaller than the distance between adjacent said members.

15. A surface-acoustic-wave device as claimed in claim 13, wherein each of said depletion layer control members has a width in said propagation direction which is less than the wavelength of said surface-acoustic-wave.

16. A surface-acoustic-wave device as claimed in claim 13, wherein the distance between adjacent said depletion layer control members is less than the wavelength of said surface-acoustic-wave.

17. A surface-acoustic-wave device as claimed in any one of claims 1, 2 or 3 in which said AC pumping voltage is of high frequency.

* * * * *

UNITED STATES PATENT AND TRADEMARK OFFICE
CERTIFICATE OF CORRECTION

PATENT NO. : 4 357 553
DATED : November 2, 1982
INVENTOR(S) : Shoichi Minagawa et al It is certified that error appears in the above—identified patent and that said Letters Patent is hereby corrected as shown below:

Column 10, line 20; change "1, 2, 3, 6 or 7" to read ---1, 2, 3, 4, 6 or 7---.

Signed and Sealed this

Twenty-second Day of February 1983

[SEAL]

Attest:

GERALD J. MOSSINGHOFF

Attesting Officer    Commissioner of Patents and Trademarks